US009117757B2

(12) United States Patent
Malhotra et al.

(10) Patent No.: US 9,117,757 B2
(45) Date of Patent: Aug. 25, 2015

(54) SILICONE POLYMERS WITH HIGH REFRACTIVE INDICES AND EXTENDED POT LIFE

(71) Applicant: Brewer Science Inc., Rolla, MO (US)

(72) Inventors: Jyoti K. Malhotra, Rolla, MO (US); Xing-Fu Zhong, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 14/055,691

(22) Filed: Oct. 16, 2013

(65) Prior Publication Data
US 2014/0103546 A1    Apr. 17, 2014

Related U.S. Application Data

(60) Provisional application No. 61/714,542, filed on Oct. 16, 2012.

(51) Int. Cl.
| | |
|---|---|
| *H01L 23/29* | (2006.01) |
| *H01L 21/56* | (2006.01) |
| *C08K 5/11* | (2006.01) |
| *H01L 33/56* | (2010.01) |
| *C08L 83/04* | (2006.01) |

(52) U.S. Cl.
CPC ............... *H01L 23/296* (2013.01); *C08K 5/11* (2013.01); *H01L 21/56* (2013.01); *C08L 83/04* (2013.01); *H01L 33/56* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,184,006 A | | 1/1980 | Hockemeyer et al. |
| 5,064,924 A | * | 11/1991 | Shimizu et al. ............... 528/15 |
| 6,555,283 B1 | | 4/2003 | Zhong et al. |
| 6,806,509 B2 | * | 10/2004 | Yoshino et al. ............ 257/103 |
| 7,375,178 B2 | | 5/2008 | Shobha et al. |
| 7,385,000 B2 | * | 6/2008 | Kuhn et al. .................. 524/588 |
| 8,080,614 B2 | * | 12/2011 | Morita et al. ................ 525/100 |
| 8,278,367 B2 | * | 10/2012 | Boettcher et al. ............. 523/109 |
| 8,373,286 B2 | * | 2/2013 | Yoshitake et al. ............ 257/791 |
| 8,610,293 B2 | * | 12/2013 | Shiobara et al. ............. 257/789 |
| 2006/0052475 A1 | | 3/2006 | Husemann et al. |
| 2008/0200580 A1 | | 8/2008 | Aoki et al. |
| 2009/0233226 A1 | | 9/2009 | Allen et al. |
| 2009/0298962 A1 | | 12/2009 | Studer et al. |
| 2011/0034581 A1 | | 2/2011 | Bae et al. |
| 2011/0254047 A1 | * | 10/2011 | Yoshitake et al. ........... 257/100 |
| 2012/0142803 A1 | * | 6/2012 | Inafuku et al. ................... 522/4 |
| 2013/0122314 A1 | * | 5/2013 | Ou ................................ 428/429 |

FOREIGN PATENT DOCUMENTS

| | | | |
|---|---|---|---|
| JP | 2005-536620 | | 12/2005 |
| JP | 2006-282657 | | 10/2006 |
| JP | 2010-047646 | * | 3/2010 |
| WO | 2006060141 | | 6/2006 |
| WO | 2011059462 A1 | | 5/2011 |

OTHER PUBLICATIONS

Machine-generated translation of JP 2010-047646 into English.*
Flaim et al., "High Refractive Index Polymer Coatings for Optoelectronics Applications," SPIE Proceedings of Optical Systems Design, vol. 5250, 2003, pp. 423-434.
F.R. Flory, Thin Films for Optical Systems, Marcel Dekker, Inc., 1995, pp. 475-507.
Harkness et al., "Photopatternable silicone compositions for electronic packaging applications," Proceedings of SPIE, vol. 5376, 2004, pp. 517-524.
M.J. Idacavage, "Halogen-Free, UV-Curable High Refractive Index Materials for Light Management," Cytec Industries, Inc., Georgia Tech Nano@Tech Seminar Series, Oct. 12, 2010, http://smartech.gatech.edu/handle/1853/35474, 31 pages.
Kalima et al., "UV-curable ZnS/polymer nanocomposite for replication of micron and submicron features," Optical Materials, vol. 31, No. 10, 2009, pp. 1540-1546.
Liu et al., "High refractive index polymers: fundamental research and practical applications," Journal of Materials Chemistry, vol. 19, 2009, pp. 8907-8919.
Lu et al., "Research on Preparation, Structure and Properties of TiO2/Polythiourethane Hybrid Optical Films with High Refractive Index," Macromolecular Materials and Engineering, vol. 288, No. 9, 2003, pp. 717-723.
Mercado et al., "Thin-film polyetherimides with controlled refractive indices," Proceedings of SPIE: Organic Photonic Materials and Devices VI, vol. 5351, 2004, pp. 276-283.
Mont et al., "High Refractive Index Nanoparticle-Loaded Encapsulants for Light-Emitting Diodes," Proceedings of SPIE, vol. 6486, 2007, pp. 64861C-1-64861C-8.
Morford et al., "High refractive index polymer coatings," 2005, 5 pages.
Morford et al., "High refractive index photocurable resins," Proceedings of SPIE: Organic Photonic Materials and Devices VII, vol. 5724, 2005, pp. 34-41.
Nitto Denko Corporation, Organic/Inorganic Hybrid Technology, http://www.nitto.com/rd/base/control/hybrid.html, 1 page.
Shobha et al., "Synthesis of High Refractive-Index Melt-Stable Aromatic Polyphosphonates," Journal of Polymer Science Part A: Polymer Chemistry, vol. 39, issue 17, 2001, pp. 2904-2910.
Vanlathem et al., "Novel Silicone Materials for LED Packaging and Opto-electronics Devices," Proceedings of SPIE, vol. 6192, 2006, pp. 619202-1-619202-8.
Wang et al., "New High Refractive Index Organic/inorganic Hybrid Materials from Sol-Gel Processing," Macromolecules, vol. 24, No. 11, 1991, pp. 3449-3450.
International Search Report and Written Opinion dated Jan. 28, 2014 in corresponding PCT/US2013/065303 filed Oct. 16, 2013.

* cited by examiner

*Primary Examiner* — Marc Zimmer
(74) *Attorney, Agent, or Firm* — Hovey Williams LLP

(57) ABSTRACT

Novel compositions and methods of using those compositions to form high refractive index coatings are provided. The compositions comprise a mixture of two silicone polymers, a catalyst, and an inhibitor for the catalyst. The preferred catalyst comprises platinum. Unlike prior art silicone systems, the inventive composition can be provided in a one-part form due to a substantially improved pot life. The compositions can be spin- or spray-applied, followed by baking to crosslink the polymers and form a cured layer. The inventive cured layers have high refractive indices and light transmissions.

25 Claims, No Drawings

SILICONE POLYMERS WITH HIGH REFRACTIVE INDICES AND EXTENDED POT LIFE

The present application claims the priority benefit of U.S. Provisional Patent Application Ser. No. 61/714,542, filed Oct. 16, 2012, entitled SILICONE POLYMERS WITH HIGH REFRACTIVE INDEXES, incorporated by reference in its entirety herein.

GOVERNMENT FUNDING

This invention was made with government support under contract number 70NANB10H012 awarded by the National Institute of Standards and Technology. The United States Government has certain rights in the invention.

BACKGROUND OF THE INVENTION

1. Field of the Invention

The present invention is broadly concerned with novel, silicone compositions having long pot lives and that can be formed into high refractive index ("RI") layers. The compositions are useful for forming solid-state devices such as flat panel displays, optical sensors, integrated optical circuits, light-emitting diodes (LEDs), microlens arrays, and optical storage disks.

2. Description of the Prior Art

A high RI value is highly desired to minimize internal reflection between compound semiconductor materials and the encapsulant materials used in high-brightness light-emitting diodes (HB LEDs). Historically, the development of materials with high refractive indices (RIs) started with the use of sputtering to deposit inorganic anti-reflective coatings on optical lenses, which is a high-cost, low-throughput process. Sol-gel coating technologies were developed to replace sputtering to produce inorganic films on the devices. However, sol-gel technologies involve a complicated manufacturing process, and they have many problems with storage stability and reliability. The optoelectronics industry is seeking more robust high RI materials that can be applied using existing equipment to achieve production at low cost and high throughput.

Various efforts to develop high RI materials have been undertaken, some involving the incorporation of heavy elements, such as bromine, or highly aromatic structures to increase RI.

Organic-inorganic hybrid coatings have also been developed. However, these coatings undergo more than 60% shrinkage during the curing process, which leads to high film stress and susceptibility to cracking for thicker films (>0.5 µm thick). The need for curing at temperatures higher than 200° C. is also a limitation for some device applications.

In addition, vacuum-deposited and chemical-vapor-deposited (CVD) optical coatings have been utilized in optoelectronics applications for many years. These coatings are traditionally limited to thin-film applications and are expensive to apply.

Finally, prior art compositions (particularly silicone-containing compositions) have short pot lives. That is, the ingredients must be provided in a two-part system because they begin to react upon mixing, and gelling occurs shortly thereafter, making the composition unusable. As a result, the end user must obtain the composition in two separate containers and mix the composition at the point and time of use. The composition must be used right away, before it becomes unusable. This results in the need to carry extra inventory, as well as to carry out additional steps during manufacturing, creating the potential for extra issues to arise with those steps.

SUMMARY OF THE INVENTION

The present invention broadly provides a method of forming an LED or other electronic or microelectronic structure. The method comprises providing a substrate having a surface; and forming a layer of a composition on the surface of the substrate. The composition comprises a mixture of first and second silicone polymers, wherein: the second polymer is different from the first polymer; and the composition has a pot life of at least about 24 hours.

The invention further comprises an LED or other microelectronic structure comprising a substrate having a surface and a layer of a composition on the surface. The composition comprises a mixture of first and second silicone polymers, wherein: the second polymer is different from the first polymer; and the composition has a pot life of at least about 24 hours.

An LED or other microelectronic structure comprising a substrate having a surface and a cured layer on the surface is also provided by the invention. The layer comprises crosslinked polymers having a structure selected from the group consisting of:

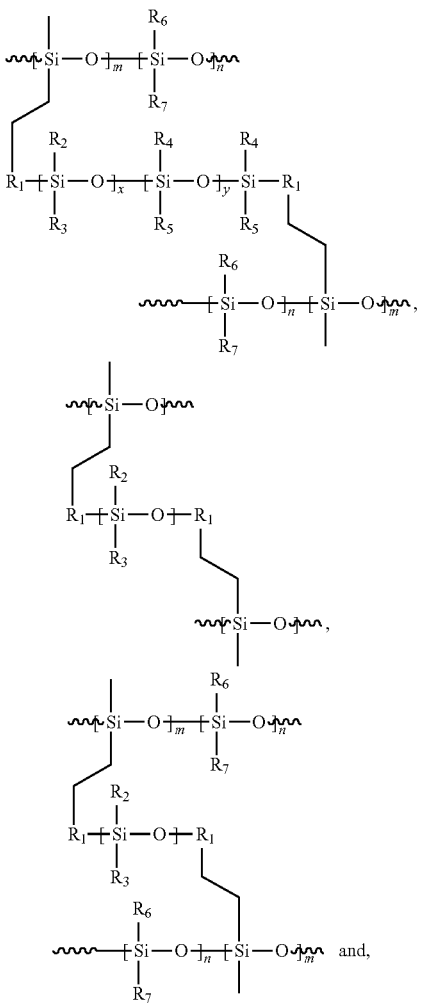

-continued

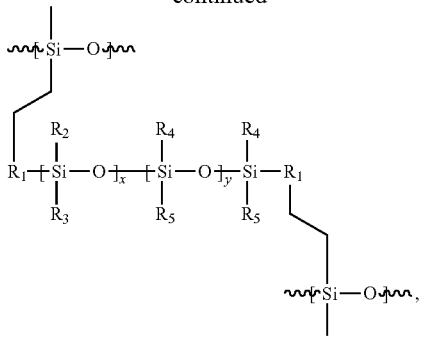

where:
each $R_1$ is individually selected from the group consisting of alkylenes; and
each of $R_2$, $R_3$, $R_4$, $R_5$, $R_6$, and $R_7$ is individually selected from the group consisting of alkyls, phenyls, aromatics, and cyclic aliphatics.

Finally, the invention is also directed towards a composition comprising a mixture of first and second silicone polymers, a catalyst, and an inhibitor. In the preferred embodiment, the second polymer is different from the first polymer; and the composition has a pot life of at least about 24 hours.

DETAILED DESCRIPTION OF THE PREFERRED EMBODIMENTS

The inventive composition comprises a one-part silicone formulation that is highly stable and can be formed into high RI coatings. The composition can additionally be formulated into nanocomposites to further increase the RI. The composition comprises first and second silicone polymers, wherein the second polymer is preferably different from the first polymer.

The first polymer can be either a homopolymer or a copolymer. Preferred first polymers are vinyl-terminated siloxanes. It is also preferred that the first polymer be phenyl- and/or methyl-containing homopolymers or copolymers of siloxane.

A preferred first polymer has a formula selected from the group consisting of

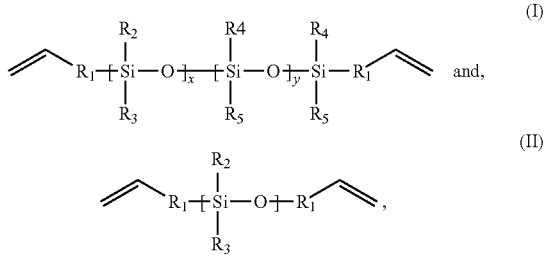

where:
each $R_1$ is individually selected from the group consisting of alkylenes (preferably $C_1$-$C_8$, and more preferably $C_1$-$C_4$); and
each of $R_2 R_3$, $R_4$, and $R_5$ is individually selected from the group consisting of alkyls (preferably $C_1$-$C_8$, and more preferably $C_1$-$C_4$), aromatics (preferably $C_6$-$C_{14}$, more preferably $C_6$-$C_{10}$, and even more preferably $C_6$, i.e, phenyl), and cyclic aliphatics (preferably $C_6$-$C_{14}$, more preferably $C_6$-$C_{10}$, and even more preferably $C_6$).

In some embodiments, $R_1$ is absent. Additionally, x:y is preferably from about 100:0 to about 70:30, and more preferably from about 97:3 to about 80:20.

Particularly preferred first polymers are selected from the group consisting of: (a) structure (I), where each of $R_2$ and $R_3$ is phenyl; and each of $R_4$ and $R_5$ is —$CH_3$; and (b) structure (II), where $R_2$ is —$C_3$, and $R_3$ is phenyl. Specific examples of suitable vinyl-terminated silicones from Gelest include PMV-9925, PDV-2331, PDV-0331, PDV-0325, and VDT-954. Specific examples of suitable phenyl- or methyl-containing polymers include PMV-9925 (a polyphenylmethyl homopolymer), the PDV silicones (diphenylsiloxane-dimethylsiloxane copolymers), and VDT-954 (a vinylmethylsiloxane-dimethylsiloxane copolymer).

Regardless of the first polymer chosen, it is preferred that the overall siloxane content be from about 85% to about 100% by weight, more preferably from about 90% to about 99% by weight, and even more preferably from about 93% by weight to about 98% by weight, based upon the total weight of the first polymer taken as 100% by weight.

Preferably, the first polymer has a weight average molecular weight of from about 2,000 Da to about 30 kDa, more preferably from about 10 kDa to about 30 kDa, and even more preferably from about 10 kDa to about 15 kDa. Additionally, the first polymer will preferably be provided in sufficient quantities to be present in the composition at a level of from about 85% to about 99.5% by weight, more preferably from about 95% to about 99% by weight, and even more preferably from about 96% by weight to about 98% by weight, based upon the total weight of the composition taken as 100% by weight.

The second polymer can also be either a homopolymer or a copolymer, and is preferably chosen so as to contain groups that will crosslink with the first polymer under the desired conditions. Suitable such crosslinker second polymers include crosslinker siloxanes such hydrido siloxanes.

A preferred second polymer has a formula selected from the group consisting of

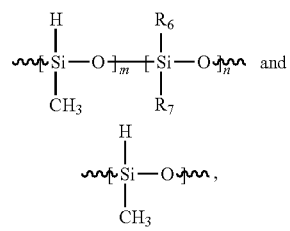

where each of $R_6$ and $R_7$ is individually selected from the group consisting of alkyls (preferably $C_1$-$C_8$, and more preferably $C_1$-$C_4$), aromatics (preferably $C_6$-$C_{14}$, more preferably $C_6$-$C_{10}$, and even more preferably $C_6$, i.e., phenyl), and cyclic aliphatics (preferably $C_6$-$C_{14}$, more preferably $C_6$-$C_{10}$, and even more preferably $C_6$).

In a preferred embodiment, $R_6$ is phenyl, and $R_7$ is —$CH_3$. In another embodiment, each of $R_6$ and $R_7$ is —$CH_3$. Additionally, m:n is preferably from about 100:0 to about 60:40, and more preferably from about 55:45 to about 50:50.

Regardless of the second polymer chosen, it is preferred that the overall siloxane content be from about 85% to about 100% by weight, more preferably from about 90% to about 99% by weight, and even more preferably from about 96% by weight to about 98% by weight, based upon the total weight of the second polymer taken as 100% by weight. Additionally, the second polymer (crosslinker) to first polymer equivalent ratio is preferably from about 0.8:1 to about 1.2:1, and more preferably from about 0.8:1 to about 1.0:1.

Preferably, the second polymer has a weight average molecular weight of from about 500 Da to about 20 kDa, more preferably from about 1 kDa to about 15 kDa, and even more preferably from about 5 kDa to about 15 kDa. Additionally, the second polymer will preferably be provided in sufficient quantities to be present in the composition at a level of from about 0.25% to about 15% by weight, more preferably from about 0.5% to about 5% by weight, and even more preferably from about 2% by weight to about 4% by weight, based upon the total weight of the composition taken as 100% by weight.

Examples of such crosslinkers for use as the second polymer include those from Gelest such as HPM-502, HMS-992, HMS-501, HMS-064, polyhydrosilsesquioxane, and other hydride-containing copolymers or homopolymers of dimethylsiloxane or phenyl-containing siloxanes.

The composition will preferably further comprise a catalyst. The preferred catalyst is one that comprises platinum. Particularly preferred such platinum catalysts include those selected from the group consisting of platinum-divinyltetramethyldisiloxane catalysts and platinum carbonyl cyclovinylmethylsiloxane complex catalysts.

The catalyst is preferably included in the composition at levels of from about 0.01% by weight to about 0.1% by weight, more preferably from about 0.5% by weight to about 0.1% by weight, and even more preferably from about 0.4% by weight to about 0.9% by weight, based upon the total solids in the composition taken as 100% by weight.

The compositions will also preferably include an inhibitor, with the inhibitor being selected to coordinate with the catalyst. Even more preferably, the inhibitor selected will coordinate with, or react with, platinum. Preferred inhibitors are volatile inhibitors such as ketones, alcohols and alkynes, such as those disclosed in U.S. Pat. No. 4,184,006, incorporated by reference herein. Suitable alkynes include, for example, 2-methyl-3-butyne-2-ol, ethynylcyclohexanol, 2-butyne, 2-methyl-but-1-en-3-yne, and phenyl acetylene.

Other inhibitors are disclosed in PCT Publication WO 2011059462, incorporated by reference herein and include such compounds as pyridine, acrylonitrile, diallyl maleate, 2-methyl-3-buten-2-ol, organic phosphines and phosphites, benzotriazole, organic sulfoxides, aminofunctional siloxanes, ethylenically unsaturated isocyanurates, olefinic siloxanes, alkenynes, unsaturated carboxylic esters, and unsaturated carboxylic amides.

The inhibitor will preferably be provided in sufficient quantities to be present in the composition at a level of from about 0.05% to about 2% by weight, more preferably from about 0.25% to about 1% by weight, and even more preferably from about 0.4% by weight to about 1% by weight, based upon the total weight of the composition taken as 100% by weight.

In a particularly preferred embodiment, the composition comprises very low levels of conventional/typical solvents or diluents (e.g., PGME, PGMEA, propylene carbonate). Thus, the composition comprises less than about 5% by weight, preferably less than about 2% by weight, and even more preferably about 0% by weight solvents or diluents, based upon the total weight of the composition taken as 100% by weight.

The compositions are formed by simply mixing the above ingredients at ambient conditions so as to create a substantially uniform mixture of the ingredients. It will be appreciated that the inventive compositions are superior to the prior art in that they have a long pot life, so they can be stored for extended periods without gelling or becoming unusable. As used herein, "pot life" means that the composition has not gelled and is still capable of being spin-applied at ambient temperatures and at spin speeds of from about 1,500 rpm to about 2,000 rpm without requiring dilution or other treatment to reverse the gelling. Compositions that have not gelled will have a Brookfield viscosity that is within about 25%, preferably within about 15%, and even more preferably within about 10% of the viscosity of the same composition at one hour after it was prepared. Furthermore, cured films prepared from the composition will have an RI of at least about 1.5 at 400 nm if the composition still has a good pot life. The inventive compositions have a pot life, as described above, of at least about 24 hours, preferably at least about a week, more preferably at least about a month, and even more preferably from about six months to a year. Advantageously, selected silicone systems even showed a pot life of 538 days and more.

The compositions are applied to a substrate by any known method to form a coating layer or film thereon. Suitable coating techniques include dip coating, roller coating, injection molding, film casting, draw-down coating, or spray coating. A preferred method involves spin coating the composition onto the substrate at a rate of from about 500 to about 5,000 rpm (preferably from about 1,000 to about 4,000 rpm) for a time period of from about 30 to about 480 seconds (preferably from about 60 to about 300 seconds) to obtain uniform films. Substrates to which the coatings can be applied include those selected from the group consisting of silicon, silicon dioxide, silicon nitride, aluminum gallium arsenide, aluminum indium gallium phosphide, gallium nitride, gallium arsenide, indium gallium phosphide, indium gallium nitride, indium gallium arsenide, aluminum oxide (sapphire), glass, quartz, polycarbonates, polyesters, acrylics, polyurethanes, papers, ceramics, metals (e.g., copper, aluminum, gold), and semiconductors.

The applied coatings are then heated for a sufficient time and to a sufficient temperature so as to cause the polymers to crosslink with one another and form a cured layer. This is typically accomplished by baking at temperatures of at least about 90° C., and more preferably from about 130° C. to about 150° C. for a time period of at least about 60 minutes (preferably from about 30 minutes to about 60 minutes). The crosslinked polymers comprise one or more of the following structure in the cured layer:

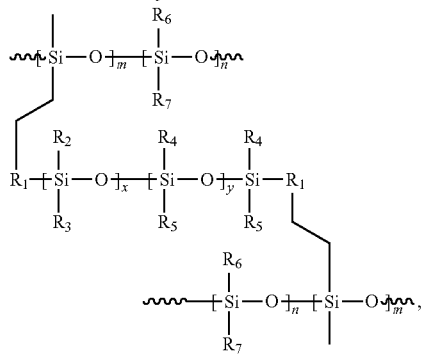

-continued

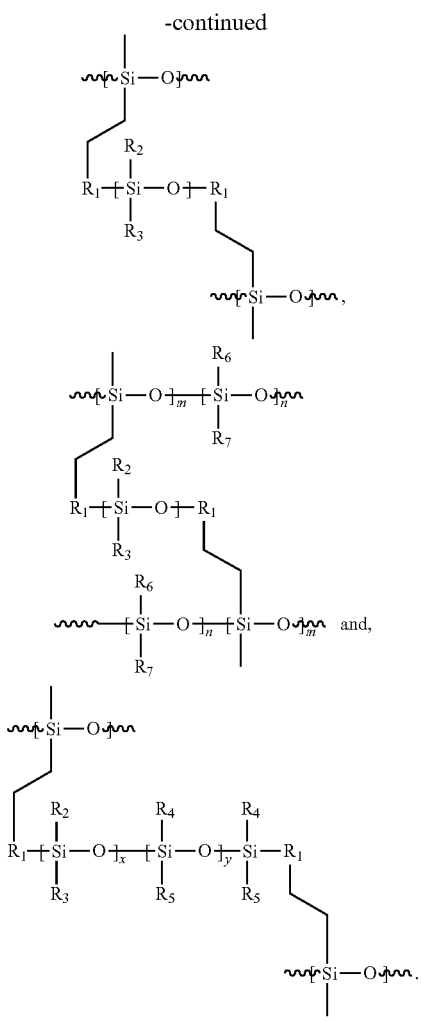

The variables above are as defined previously.

Cured coatings prepared according to the instant invention will have superior properties, and can be formulated to have thicknesses of from about 15 μm to about 35 μm, and more preferably from about 20 μm to about 30 μm. At these thicknesses, the cured coatings will have a refractive index of at least about 1.4, preferably at least about 1.5, and more preferably at least about 1.56, at wavelengths of from about 375 nm to about 1,700 nm, and preferably about 400 nm. Furthermore, cured coatings having a thickness of about 100 μm will have a percent transmittance of at least about 80%, preferably at least about 90%, and even more preferably least about 95% at wavelengths of from about 375 nm to about 1700 nm, and preferably about 400 nm.

It will be appreciated that the inventive one-part system offers significant advantages over prior art two-part systems. Some of those advantages include less labor, less material (i.e., one bottle instead of two), easier inventory tracking, easier to use, no concerns about microbubble formation or other issues that take place when mixing at time of use, and enhanced throughput.

EXAMPLES

The following examples set forth preferred methods in accordance with the invention. It is to be understood, however, that these examples are provided by way of illustration and nothing therein should be taken as a limitation upon the overall scope of the invention.

Example 1

Polyphenylmethylsiloxane-Based Formulation in the Presence of Platinum-Divinyltetramethyldisiloxane Catalyst A vinyl-terminated polyphenylmethylsiloxane (PMV-9925, Gelest, Arlington, Va.) in the amount of 5 grams was blended with 0.64 gram of hydride-terminated methylhydrosiloxane-phenylmethylsiloxane copolymer (HPM-502, Gelest, Arlington, Va.). This blend was stirred for 10 minutes at room temperature. Next, about 0.055-0.06 gram of a 0.1% solution (10 ppm) of platinum-divinyltetramethyldisiloxane catalyst (SIP6831.2. Gelest, Arlington, Va.) in propylene glycol monomethyl ether acetate ("PGMEA") was added. After the catalyst was added, the blend was stirred for 10 minutes at room temperature.

Films made from this formulation had refractive index ("RI") values of 1.577 at 400 nm and 1.53 at 700 nm, as well as k values of 10.0023-0.00028 for the visible light wavelengths. The thermal degradation temperature of the composition was 223° C. The formulation was spin-coated on a silicon wafer for 60 seconds at 1,500 rpm, followed by baking for 60 minutes at 140° C. This formulation delivered a film thickness of 13.6 μm and had a pot life of 7 days with a slight increase in film thickness at day 7 (14.5 μm).

Example 2

Polyphenylmethylsiloxane-Based Formulation in the Presence of Platinum Carbonyl Cyclovinylmethylsiloxane Complex Catalyst This formulation was made by using the same reagents and amounts mentioned in Example 1, with the exception of using a different catalyst. That is, a 0.1% solution of a platinum carbonyl cyclovinylmethylsiloxane complex in PGMEA (10 ppm; SIP6829.2, Gelest, Arlington, Va.) was utilized.

Films made from this Example 2 formulation had RI values of 1.57 at 400 nm and 1.53 at 700 nm, as well as a k value of 0.0000 for the visible light wavelengths. The thermal degradation temperature of the composition was 226° C. The formulation was spin-coated on a silicon wafer for 60 seconds at 1,500 rpm, followed by baking for 60 minutes at 140° C. This formulation delivered a film thickness of 14.5 μm and had a pot life of 7 days, with a slight increase in film thickness when another film was made as described above at day 7 (15.8 μm).

Example 3

Polyphenylmethylsiloxane-Based Formulation in the Presence of a Platinum-Divinyltetramethyldisiloxane Catalyst This formulation was made by using the same amounts of PMV polymer and HPM-502 crosslinker as mentioned in Example 1 but with a greater amount of SIP6831.2 catalyst. That is, this formulation was made using 0.005 gram of undiluted SIP6831.2 catalyst, a concentration of 1,000 ppm.

Films made from this PMV-based formulation had RI values of 1.57 at 400 nm and 1.53 at 700 nm as well as a k value of 0.0000 for the visible light wavelengths. The thermal degradation temperature of the composition was 230° C. The formulation was spin-coated on a silicon wafer for 60 seconds at 1,500 rpm, followed by baking for 60 minutes at 140° C. This formulation delivered a film thickness of 16.3 μm and had a pot life of 1 day. The formulation gelled on day 2.

Example 4

Polyphenylmethylsiloxane-Based Formulation in the Presence of Platinum Carbonyl Cyclovinylmethylsiloxane Complex Catalyst This formulation was made by using the same ratio of PMV polymer to HPM-502 crosslinker as mentioned in the preceding Examples, but with a greater ratio of the platinum carbonyl cyclovinylmethylsiloxane complex catalyst than used in Example 2. Specifically, this formulation was made using 0.005 gram of undiluted SIP6829.2 catalyst, giving a catalyst concentration of 1,000 ppm.

Films made from this PMV-based formulation possessed RI values of 1.57 at 400 nm and 1.53 at 700 nm, as well as a k value of 0.0000 for the visible light wavelengths. Thermal degradation temperature of the composition was 245° C. The formulation was spin-coated on a silicon wafer for 60 seconds at 1,500 rpm, followed by baking for 60 minutes at 140° C. This formulation delivered a film thickness of 15.5 μm, but on day 2, the film thickness increased to 21.7 μm when another film was made as described above, and the formulation gelled on day 3.

Example 5

Polyphenylmethylsiloxane-Based Formulation in the Presence of a Maleic Acid Diallylester Inhibitor and Platinum-Divinyltetramethyldisiloxane Catalyst PMV-9925 (same vinyl-terminated polyphenylmethylsiloxane as the previous Examples) in the amount of 5 grams was blended with 0.64 gram of HPM-502 (the hydride-terminated methylhydrosiloxane-phenylmethylsiloxane copolymer used in the previous Examples). This blend was stirred for 10 minutes at room temperature. Next, 0.005 gram of a maleic acid diallylester inhibitor (SL6040-D1, Momentive Performance, Columbus Ohio) was added, and the mixture was stirred for 10 minutes at room temperature. Finally, about 0.005 gram of undiluted, as-received SIP6831.2 catalyst was added, and the blend was stirred for 10 minutes at room temperature.

Films made from this PMV-based formulation had RI values of 1.56 at 400 nm and 1.53 at 700 nm, as well as k values of 0.0000-0.00159 for the visible light wavelengths. The thermal degradation temperature of the composition was 223° C. The formulation was spin-coated on a silicon wafer for 60 seconds at 1,500 rpm, followed by baking for 60 minutes at 140° C. This formulation delivered a film thickness of 17.2 μm. The formulation had a pot life of 1 day and gelled on day 3.

Example 6

Polyphenylmethylsiloxane-Based Formulation in the Presence of Platinum Carbonyl Cyclovinylmethylsiloxane Complex Catalyst and a Maleic Acid Diallylester Inhibitor Inhibitor This formulation was prepared by following the same procedure and using the same amounts of reagents as indicated in Example 5 but with 0.005 gram of undiluted, as-received SIP6829.2 catalyst (instead of SIP6831.2 catalyst).

Films made from this PMV-based formulation had RI values of 1.57 at 400 nm and 1.53 at 700 nm as well as k values of 0.0000-0.00116 for the visible light wavelengths. Thermal degradation temperature of the composition was 229° C. The formulation was spin-coated on a silicon wafer for 60 seconds at 1,500 rpm, followed by baking for 60 minutes at 140° C. This formulation delivered a film thickness of 16.21 μm, which increased to 21.4 um on day 7 and 24.9 μm on day 8, when additional films were made as described above. On day 9, the sample exhibited a film thickness of 39.8 μm, and the formulation gelled on day 10.

Example 7

Diphenylsiloxane-Dimethylsiloxane Copolymer-Based Formulation in the Presence of Hydride-Terminated Methylhydrosiloxane-Phenylmethylsiloxane Copolymer Crosslinker Vinyl-terminated diphenylsiloxane-dimethylsiloxane (PDV-2331, Gelest, Arlington, Va.) in the amount of 5 grams was blended with 0.1665 gram of hydride-terminated methylhydrosiloxane-phenylmethylsiloxane copolymer (HPM-502). This blend was stirred for 10 minutes at room temperature. Finally, 0.005 gram of undiluted, as-received SIP6831.2 catalyst was added. After the catalyst was added, the blend was stirred for 10 minutes at room temperature.

This PDV-2331-based formulation had RI values of 1.53 at 400 nm and 1.50 at 700 nm as well as k values of 0.0032-0.0039 for the visible light wavelengths. The thermal degradation temperature of the composition was 344° C. The formulation was spin-coated on a silicon wafer for 60 seconds at 1,500 rpm, followed by baking for 60 minutes at 140° C. This formulation delivered a film thickness of 27.9 μm and had a pot life of 1 day. The formulation gelled on day 2.

Example 8

Diphenylsiloxane-Dimethylsiloxane Copolymer-Based Formulation in the Presence of HMS-501 Crosslinker Low-molecular-weight (10,000-15,000 Daltons) vinyl-terminated diphenylsiloxane-dimethylsiloxane (PDV-2331, 1000-1500 cSt) in the amount of 5 grams was blended with 0.11 gram of trimethylsiloxane-terminatedmethyl hydrosiloxane-dimethylsiloxane copolymer (HMS-501, Gelest, Arlington, Va.). This blend was stirred for 10 minutes at room temperature. Next, about 0.005 gram of undiluted, as-received SIP6831.2 catalyst was added. After the catalyst was added, the blend was stirred for 10 minutes at room temperature.

This PDV-2331-based formulation had RI values of 1.52 at 400 nm and 1.49 at 700 nm as well as k values of 0.0000-0.00031 for the visible light wavelengths. The thermal degradation temperature of the composition was 325° C. The formulation was spin-coated on a silicon wafer for 60 seconds at 1,500 rpm, followed by baking for 60 minutes at 140° C. This formulation delivered a film thickness of 28.6 μm and had a pot life of 1 day, and the formulation gelled on day 2.

Example 9

High-Molecular Weight Diphenylsiloxane-Dimethylsiloxane Copolymer-Based Formulation in the Presence of HMS-992 Crosslinker High-molecular-weight (25,000-30,000 Daltons) vinyl-terminated diphenylsiloxane-dimethylsiloxane (PDV-0331, 1000 cSt; Gelest, Arlington, Va. in the amount of 5 grams was blended with 0.0215 gram of trimethylsilyl-terminated polymethylhydrosiloxane (HMS-992, Gelest, Arlington, Va.). This blend was stirred for 10 minutes at room temperature. Finally, 0.005 gram of undiluted, as-received SIP6831.2 catalyst was added. After the catalyst was added, the blend was stirred for 10 minutes at room temperature.

This PDV-0331-based formulation had RI values of 1.43 at 400 nm and 1.42 at 700 nm, as well as k values of 0.0000-0.00114 for the visible light wavelengths. The thermal degradation temperature of the composition was 326° C. The formulation was spin-coated on a silicon wafer for 60 seconds at 1,500 rpm, followed by baking for 60 minutes at 140° C. This formulation delivered a film thickness of 27.9 µm and had a pot life of 7 days. Film thickness on day 4 was 28.74 µm and on day 7 it was 31.2 µm. The formulation gelled on day 8.

Example 10

Diphenylsiloxane-Dimethylsiloxane Copolymer-Based Formulation in the Presence SL6040-D1 Inhibitor This formulation was prepared by using the same reagents and amounts as in Example 7, with the exception of adding 0.005 gram of as received SL6040-D1 inhibitor to the blend before the catalyst was added. After the inhibitor was added but before the catalyst was added, the blend was stirred for 10 minutes at room temperature. The Brookfield viscosity at 25° C. was 795 cP.

This PDV-2331-based formulation with inhibitor had RI values of 1.53 at 400 nm and 1.49 at 700 nm as well as k values of 0.0000-0.00035 for the visible light wavelengths. The thermal degradation temperature of the composition was 357° C. The formulation was spin-coated on a silicon wafer for 60 seconds at 1,500 rpm, followed by baking for 30 minutes at 140° C. This formulation delivered a film thickness of 22.0 µm and it delivered a 27.0 µm film thickness on day 21. The formulation gelled on day 22.

Example 11

Diphenylsiloxane-Dimethylsiloxane Copolymer-Based Formulation in the Presence SL6040-D1 Inhibitor This formulation was prepared by using the same reagents and amounts as in Example 8, with the exception of adding 0.005 gram of as received solution of SL6040-D1 to the blend before the catalyst was added. After the inhibitor was added but before the catalyst was added, the blend was stirred for 10 minutes at room temperature. The Brookfield viscosity at 25° C. was 820 cP.

This PDV-2331-based formulation with inhibitor had RI values of 1.52 at 400 nm and 1.49 at 700 nm as well as k values of 0.0000-0.00034 for the visible light wavelengths. The thermal degradation temperature of the composition was 339° C. The formulation was spin-coated on a silicon wafer for 60 seconds at 1,500 rpm, followed by baking for 30 minutes at 140° C. This formulation delivered a film thickness of 22.0 µm and delivered a 27.0 µm film thickness on day 21. The formulation gelled on day 22.

Example 12

High-Molecular Weight Diphenylsiloxane-Dimethylsiloxane Copolymer-Based Formulation in the Presence SL6040-D1 Inhibitor This formulation was prepared by using the same reagents and amounts as in Example 9, with the exception of adding 0.005 gram of as received solution of SL6040-D1 inhibitor to the blend before the catalyst was added. After the inhibitor was added but before the catalyst was added, the blend was stirred for 10 minutes at room temperature. The Brookfield viscosity at 25° C. was 950 cP.

This PDV-0331-based formulation with inhibitor had RI values of 1.44 at 400 nm and 1.42 at 700 nm as well as k values of 0.0000-0.00037 for the visible light wavelengths. The thermal degradation temperature of the composition was 332° C. The formulation was spin-coated on a silicon wafer for 60 seconds at 1,500 rpm, followed by baking for 30 minutes at 140° C. This formulation delivered film thickness of 22.0 µm and delivered a 27.0 µm film thickness on day 15. The formulation gelled on day 16.

Example 13

Diphenylsiloxane-Dimethylsiloxane Copolymer-Based Formulation in the Presence SL6040-D1 Inhibitor This formulation was prepared by using the same reagents and amounts as in Example 10, with the exception of adding 0.05 gram of as received solution of SL6040-D1 inhibitor to the blend before the catalyst was added. After the inhibitor was added but before the catalyst was added, the blend was stirred for 10 minutes at room temperature. The Brookfield viscosity at 25° C. was 350 cP.

This PDV-2331-based formulation with inhibitor had RI values of 1.53 at 400 nm and 1.49 at 700 nm as well as k values of 0.0000-0.00035 for the visible light wavelengths. The thermal degradation temperature of the composition was 357° C. The formulation was spin-coated on a silicon wafer for 60 seconds at 1,500 rpm, followed by baking for 30 minutes at 140° C. This formulation delivered a film thickness of 19.4 µm and on day 38 it delivered a 18.2 µm film thickness. On day 538, this formulation delivered a film with 27.0 µm thickness and was ungelled.

Example 14

Diphenylsiloxane-Dimethylsiloxane Copolymer-Based Formulation in the Presence SL6040-D1 Inhibitor This formulation was prepared by using the same reagents and amounts as in Example 11, with the exception of adding 0.05 gram of as received solution of SL6040-D1 inhibitor to the blend before the catalyst was added. After the inhibitor was added but before the catalyst was added, the blend was stirred for 10 minutes at room temperature.

This PDV-2331-based formulation with inhibitor had RI values of 1.52 at 400 nm and 1.49 at 700 nm as well as k values of 0.0000-0.00034 for the visible light wavelengths. The thermal degradation temperature of the composition was 339° C. The formulation was spin-coated on a silicon wafer for 60 seconds at 1,500 rpm, followed by baking for 30 minutes at 140° C., This formulation delivered a film thickness of 20.7 µm and on day 38 it delivered a 17.9 µm film thickness. On day 538, this formulation delivered a film with 24.5 µm thickness and was ungelled.

Example 15

High-Molecular Weight Diphenylsiloxane-Dimethylsiloxane Copolymer-Based Formulation in the Presence SL6040-D1 Inhibitor This formulation was prepared by using the same reagents and amounts as in Example 12, with the exception of adding 0.05 gram of as received solution of SL6040-D1 inhibitor to the blend before the catalyst was added. After the inhibitor was added but before the catalyst was added, the blend was stirred for 10 minutes at room temperature.

This PDV-0331-based formulation with inhibitor had RI values of 1.44 at 400 nm and 1.42 at 700 nm as well as k values of 0.0000-0.00037 for the visible light wavelengths. The thermal degradation temperature of the composition was 332° C. The formulation was spin-coated on a silicon wafer for 60 seconds at 1,500 rpm, followed by baking for 30 minutes at 140° C. This formulation delivered an initial film thickness of 17.8 μm and on day 38 it delivered a 22.6 μm film thickness.

Example 16

Polyphenylmethylsiloxane-Based Formulation in the Presence of SL6040-D1 Inhibitor and SIP6831.2 Catalyst This formulation was prepared by using the same reagents and amounts as in Example 5, with the exception of adding 0.05 gram of as received solution of SL6040-D1 inhibitor to the blend before the catalyst was added. After the inhibitor was added but before the catalyst was added, the blend was stirred for 10 minutes at room temperature.

Films made from this PMV-based formulation had RI values of 1.56 at 400 nm and 1.53 at 700 nm as well as k values of 0.0000-0.00159 for the visible light wavelengths. The thermal degradation temperature of the composition was 223° C. The formulation was spin-coated on a silicon wafer for 60 seconds at 1,500 rpm, followed by baking for 30 minutes at 140° C. This formulation delivered an initial film thickness of 17.8 μm and increased to 22.6 μm when another film was made as described above at day 38.

We claim:

1. A method of forming an LED or other electronic or microelectronic structure, said method comprising:
   providing a substrate having a surface; and
   forming a layer of a composition on said surface, said composition comprising first and second silicone polymers and a maleic acid diallylester inhibitor, wherein:
   said second polymer is different from said first polymer; and
   said composition has a pot life of at least about 30 days.

2. The method of claim 1, wherein said composition was prepared at least about 12 hours prior to said forming.

3. The method of claim 1, wherein said substrate is selected from the group consisting of semiconductors, silicon, silicon dioxide, silicon nitride, aluminum gallium arsenide, aluminum indium gallium phosphide, gallium nitride, gallium arsenide, indium gallium phosphide, indium gallium nitride, indium gallium arsenide, aluminum oxide, glass, quartz, polycarbonates, polyesters, acrylics, polyurethanes, papers, ceramics, and metals.

4. The method of claim 1, wherein said first polymer is selected from the group consisting of

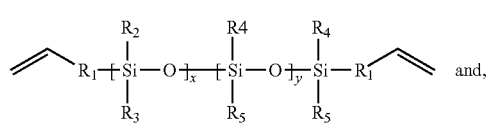

(I)

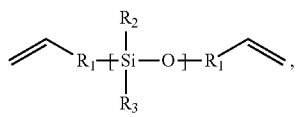

(II)

where:
   each $R_1$ is individually selected from the group consisting of alkylenes; and
   each of $R_2$, $R_3$, $R_4$, and $R_5$ is individually selected from the group consisting of alkyls, aromatics, and cyclic aliphatics.

5. The method of claim 4, wherein said first polymer has a structure selected from the group consisting of:
   (a) structure (I), where each of $R_2$ and $R_3$ is phenyl; and each of $R_4$ and $R_5$ is —$CH_3$; and
   (b) structure (II), where $R_2$ is —$CH_3$, and $R_3$ is phenyl.

6. The method of claim 1, wherein said second polymer is selected from the group consisting of

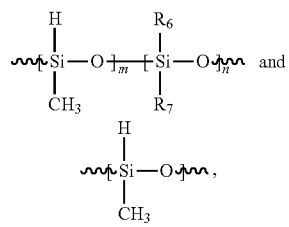

where each of $R_6$ and $R_7$ is individually selected from the group consisting of alkyls, aromatics, and cyclic aliphatics.

7. The method of claim 6, wherein said second polymer has a structure selected from the group consisting of:
   (a) $R_6$ is phenyl; $R_7$ is —$CH_3$; and
   (b) each of $R_6$ and $R_7$ is —$CH_3$.

8. The method of claim 1, said composition further comprising an ingredient selected from the group consisting of catalysts, inhibitors, and mixtures thereof.

9. The method of claim 8, wherein said composition comprises a catalyst, and said catalyst is a platinum-containing catalyst.

10. The method of claim 8, wherein said ingredient is an inhibitor that coordinates with platinum.

11. The method of claim 8, further comprising heating said layer for a sufficient time and to a sufficient temperature so as to cause said polymers to crosslink with one another so as to form a cured layer.

12. The method of claim 11, wherein the crosslinked polymers in the cured layer have a structure selected from the group consisting of:

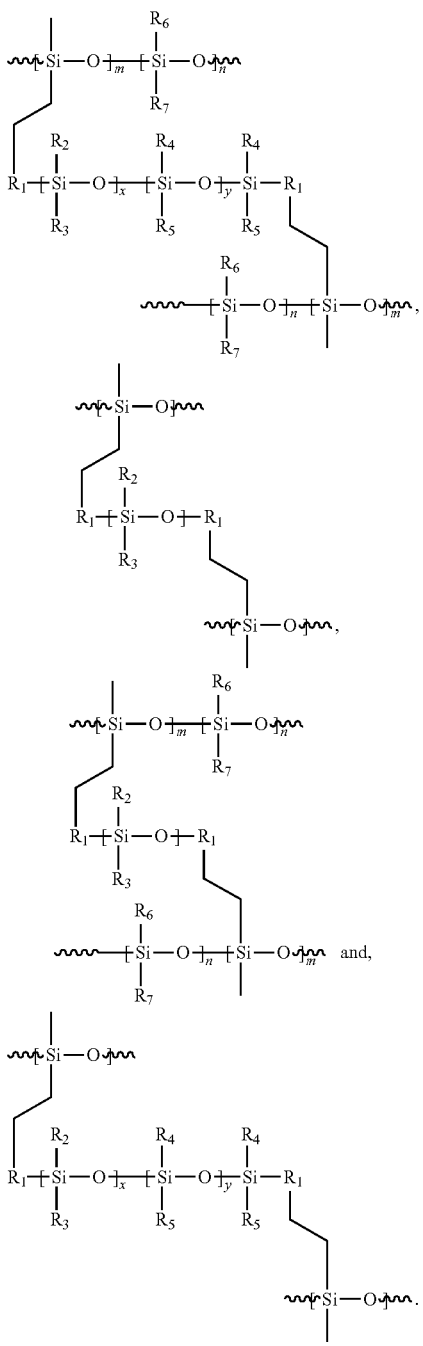

13. The method of claim 11, wherein said cured layer has a refractive index of at least about 1.5 at a wavelength of from about 375-1,700 nm.

14. The method of claim 11, wherein said cured layer has a percent transmittance of at least about 80% of light at a wavelengths of from about 375-1,700 nm and at a layer thickness of about 100 μm.

15. The method of claim 1, wherein said composition has a pot life of at least about one year.

16. An LED or other microelectronic structure comprising:
a substrate having a surface; and
a layer of a composition on said surface, said composition comprising first and second silicone polymers and a maleic acid diallylester inhibitor, wherein:

said second polymer is different from said first polymer; and
said composition has a pot life of at least about 30 days.

17. The structure of claim 16, wherein said substrate is selected from the group consisting of semiconductors, silicon, silicon dioxide, silicon nitride, aluminum gallium arsenide, aluminum indium gallium phosphide, gallium nitride, gallium arsenide, indium gallium phosphide, indium gallium nitride, indium gallium arsenide, aluminum oxide, glass, quartz, polycarbonates, polyesters, acrylics, polyurethanes, papers, ceramics, and metals.

18. The structure of claim 16, wherein said first polymer comprises a structure selected from the group consisting of

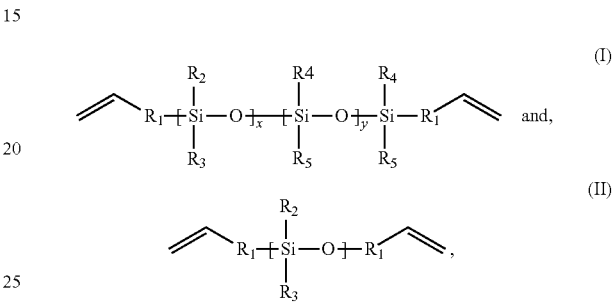

where:
each $R_1$ is individually selected from the group consisting of alkylenes; and
each of $R_2 R_3$, $R_4$, and $R_5$ is individually selected from the group consisting of alkyls, aromatics, and cyclic aliphatics.

19. The structure of claim 18, wherein said first polymer has a structure selected from the group consisting of:
(a) structure (I), where each of $R_2$ and $R_3$ is phenyl; and each of $R_4$ and $R_5$ is —$CH_3$; and
(b) structure (II), where $R_2$ is —$CH_3$, and $R_3$ is phenyl.

20. The structure of claim 16, wherein said second polymer comprises a structure selected from the group consisting of

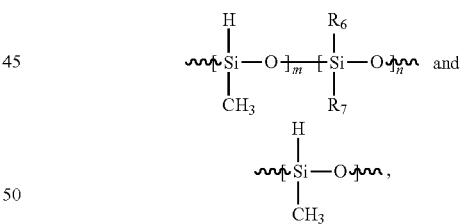

where each of $R_6$ and $R_7$ is individually selected from the group consisting of alkyls, aromatics, and cyclic aliphatics.

21. The structure of claim 20, wherein said second polymer has a structure selected from the group consisting of:
(a) $R_6$ is phenyl; $R_7$ is —$CH_3$; and
(b) each of $R_6$ and $R_7$ is —$CH_3$.

22. The structure of claim 16, said composition further comprising an ingredient selected from the group consisting of catalysts, inhibitors, and mixtures thereof.

23. The structure of claim 22, wherein said composition comprises a catalyst, and said catalyst is a platinum-containing catalyst.

24. The structure of claim 22, wherein said ingredient is an inhibitor that coordinates with platinum.

25. The structure of claim 16, wherein said composition has a pot life of at least about one year.

* * * * *